United States Patent
Fiorenza et al.

(10) Patent No.: US 11,637,096 B2
(45) Date of Patent: Apr. 25, 2023

(54) GALLIUM NITRIDE AND SILICON CARBIDE HYBRID POWER DEVICE

(71) Applicant: Analog Devices, Inc., Wilmington, MA (US)

(72) Inventors: James G. Fiorenza, Carlisle, MA (US); Puneet Srivastava, Wilmington, MA (US); Daniel Piedra, Somerville, MA (US)

(73) Assignee: Analog Devices, Inc., Wilmington, MA (US)

(*) Notice: Subject to any disclaimer, the term of this patent is extended or adjusted under 35 U.S.C. 154(b) by 0 days.

(21) Appl. No.: 17/837,671

(22) Filed: Jun. 10, 2022

(65) Prior Publication Data
US 2022/0310578 A1    Sep. 29, 2022

Related U.S. Application Data

(62) Division of application No. 17/020,189, filed on Sep. 14, 2020, now Pat. No. 11,393,806.
(Continued)

(51) Int. Cl.
*H01L 25/18* (2023.01)
*H01L 23/00* (2006.01)
(Continued)

(52) U.S. Cl.
CPC .............. *H01L 25/18* (2013.01); *H01L 24/32* (2013.01); *H01L 24/83* (2013.01);
(Continued)

(58) Field of Classification Search
CPC ..... H01L 25/18; H01L 25/0657; H01L 25/50; H01L 24/32; H01L 24/83;
(Continued)

(56) References Cited

U.S. PATENT DOCUMENTS

| 5,258,318 A | 11/1993 | Buti et al. |
| 8,013,391 B2 | 9/2011 | Yedinak et al. |

(Continued)

FOREIGN PATENT DOCUMENTS

| JP | 2008112774 A | 5/2008 |
| JP | 2011134910 A | 7/2011 |

(Continued)

OTHER PUBLICATIONS

U.S. Appl. No. 17/020,189, filed Sep. 14, 2020, Gallium Nitride and Silicon Carbide Hybrid Power Device.

(Continued)

*Primary Examiner* — Timor Karimy
(74) *Attorney, Agent, or Firm* — Schwegman Lundberg & Woessner, P.A.

(57) ABSTRACT

A hybrid silicon carbide (SiC) device includes a first device structure having a first substrate comprising SiC of a first conductivity type and a first SiC layer of the first conductivity type, where the first SiC layer is formed on a face of the first substrate. The first device structure also includes a second SiC layer of a second conductivity type that is formed on a face of the first SiC layer and a first contact region of the first conductivity type, where the first contact region traverses the second SiC layer and contacts the first SiC. The device also includes a second device structure that is bonded to the first device structure. The second device structure includes a switching device formed on a second substrate and a second contact region that traverses a first terminal region of the switching device and contacts the first contact region.

16 Claims, 13 Drawing Sheets

Related U.S. Application Data

(60) Provisional application No. 62/904,380, filed on Sep. 23, 2019.

(51) Int. Cl.
*H01L 25/00* (2006.01)
*H01L 25/065* (2023.01)

(52) U.S. Cl.
CPC .......... *H01L 25/0657* (2013.01); *H01L 25/50* (2013.01); *H01L 2224/32145* (2013.01); *H01L 2224/83005* (2013.01); *H01L 2224/83896* (2013.01); *H01L 2225/06524* (2013.01); *H01L 2924/1033* (2013.01); *H01L 2924/10253* (2013.01); *H01L 2924/10272* (2013.01); *H01L 2924/10329* (2013.01); *H01L 2924/13062* (2013.01); *H01L 2924/13064* (2013.01); *H01L 2924/13091* (2013.01)

(58) Field of Classification Search
CPC . H01L 2224/32145; H01L 2224/83005; H01L 2224/83896; H01L 2225/06524; H01L 2924/10253; H01L 2924/10272; H01L 2924/10329; H01L 2924/1033; H01L 2924/13062; H01L 2924/13064; H01L 2924/13091; H10B 80/00; H10K 19/00; H10K 39/10; H10K 59/90; H10K 65/00; H10N 39/00; H10N 69/00; H10N 89/00; H10N 79/00

See application file for complete search history.

(56) References Cited

U.S. PATENT DOCUMENTS

| | | | |
|---|---|---|---|
| 8,431,991 B2 | 4/2013 | Iwamuro | |
| 8,637,360 B2 | 1/2014 | Hebert | |
| 8,884,309 B2 | 11/2014 | Miura | |
| 9,111,750 B2 | 8/2015 | Kashyap et al. | |
| 9,252,266 B2 | 2/2016 | Iwamuro | |
| 9,349,855 B2 | 5/2016 | Kumagai | |
| 9,419,133 B2 | 8/2016 | Kinoshita et al. | |
| 9,653,588 B2 | 5/2017 | Zhang et al. | |
| 9,837,531 B2 | 12/2017 | Nakano et al. | |
| 11,393,806 B2 | 7/2022 | Fiorenza et al. | |
| 2005/0184354 A1 | 8/2005 | Chu et al. | |
| 2006/0073621 A1 | 4/2006 | Kneissel et al. | |
| 2012/0256193 A1 | 10/2012 | Hebert et al. | |
| 2016/0126092 A1 | 5/2016 | Makifuchi et al. | |
| 2021/0066488 A1 | 3/2021 | Konstantinov | |
| 2021/0091061 A1 | 3/2021 | Fiorenza et al. | |

FOREIGN PATENT DOCUMENTS

| | | |
|---|---|---|
| JP | 5145694 B2 | 12/2012 |
| JP | 5667926 B2 | 12/2014 |
| JP | 5682102 B2 | 1/2015 |
| TW | I749778 B | 12/2021 |
| WO | WO-2016092031 A1 | 6/2016 |

OTHER PUBLICATIONS

"U.S. Appl. No. 17/020,189, 312 Amendment filed May 17, 2022", 3 pgs.

"U.S. Appl. No. 17/020,189, Notice of Allowance dated Apr. 28, 2022", 10 pgs.

"U.S. Appl. No. 17/020,189, PTO Response to Rule 312 Communication dated May 27, 2022", 2 pgs.

"U.S. Appl. No. 17/020,189, Response filed Feb. 1, 2022 to Restriction Requirement dated Dec. 2, 2021", 7 pgs.

"U.S. Appl. No. 17/020,189, Restriction Requirement dated Dec. 2, 2021", 6 pgs.

"Taiwanese Application Serial No. 109132532, First Office Action dated May 21, 2021", w/o English translation, 4 pgs.

"Taiwanese Application Serial No. 109132532, Response filed Jul. 23, 2021 to First Office Action dated May 21, 2021", w/o English Translation, 33 pgs.

Millan, Jose, et al., "A Survey of Wide Bandgap Power Semiconductor Devices", IEEE Transactions on Power Electronics, 29(5), (May 2014), 2155-2163.

Williams, Richard K, et al., "The Trench Power MOSFET: Part I—History, Technology, and Prospects", IEEE Transactions on Electron Devices, 64(3), pp. 674-691, (Mar. 2017), 19 pgs.

US 11,637,096 B2

GALLIUM NITRIDE AND SILICON CARBIDE HYBRID POWER DEVICE

CLAIM OF PRIORITY

This application is a division of U.S. patent application Ser. No. 17/020,189, filed Sep. 14, 2020, which claims the benefit of priority to U.S. Provisional Patent Application Ser. No. 62/904,380, filed Sep. 23, 2019, which are incorporated herein in their entirety.

FIELD OF THE DISCLOSURE

This document pertains generally, but not by way of limitation, to power semiconductor devices, and more particularly, to hybrid silicon carbide power devices.

BACKGROUND

Power switching devices include semiconductor devices, such as transistors and rectifiers, that are used in power circuits for their ability to switch, rectify, or conduct large currents while being resilient to high voltages. Silicon based power metal oxide semiconductor field-effect transistors (MOSFETS) are typically used in such applications due to the maturity of their fabrication process and the capability of these devices for handling large amounts of current and high voltages. Such devices, however, are approaching their physical limits due to nascent applications that have ever increasing operating speed, power loss, and temperature requirements. Wide bandgap semiconductor devices, such as semiconductor devices made from substrate materials such as silicon carbide, are candidates for replacing silicon based power devices due to their low on resistance and their ability to handle voltages and switch at frequencies that far exceed the capabilities of silicon based devices. However, the relatively high gate bias voltage and other electrical characteristics of SiC devices can cause reliability problems and makes it difficult to interface with or control these devices.

SUMMARY OF THE INVENTION

Aspects of the present disclosure include a hybrid silicon carbide (SiC) device. The device can include a first device structure having a first substrate comprising SiC of a first conductivity type and a first SiC layer of the first conductivity type, where the first SiC layer formed on a face of the first substrate. The first device structure can also includes a second SiC layer of a second conductivity type, where the second SiC layer is formed on a face of the first SiC layer and a first contact region of the first conductivity type, where the first contact region traverses the second SiC layer and contacts the first SiC. The device can also include a second device structure that is bonded to the first device structure. The second device structure can include a switching device formed on a second substrate and a second contact region that traverses a first terminal region of the switching device and contacts the first contact region.

Other aspects of the present disclosure include a silicon carbide device to switch an electrical signal. The device can include a first structure having a first substrate layer comprising silicon carbide of a first conductivity type. The first structure can also include a first silicon carbide layer of the first conductivity type, where the first silicon carbide layer is formed on a surface of the first substrate layer. The first structure can additionally include a second silicon carbide layer of first conductivity type, where the second silicon carbide layer is formed on a surface of the first silicon carbide layer. The first structure can additionally include a third silicon carbide layer of a second conductivity type, where the third silicon carbide layer is formed on a face of the second silicon carbide layer. The first structure can further include a contact region that has a cavity that extends from a surface of the third silicon carbide layer to contact the third silicon carbide layer. The device can also include a second device structure that is bonded to the first device structure. The second device structure can include a switching device formed on a second substrate and a contact that traverses a first terminal region of the switching device and the contact region to contact the third device structure.

Additional aspects of the present disclosure include methods or techniques for fabricating the hybrid silicon carbide device and the silicon carbide device.

Figure 1:
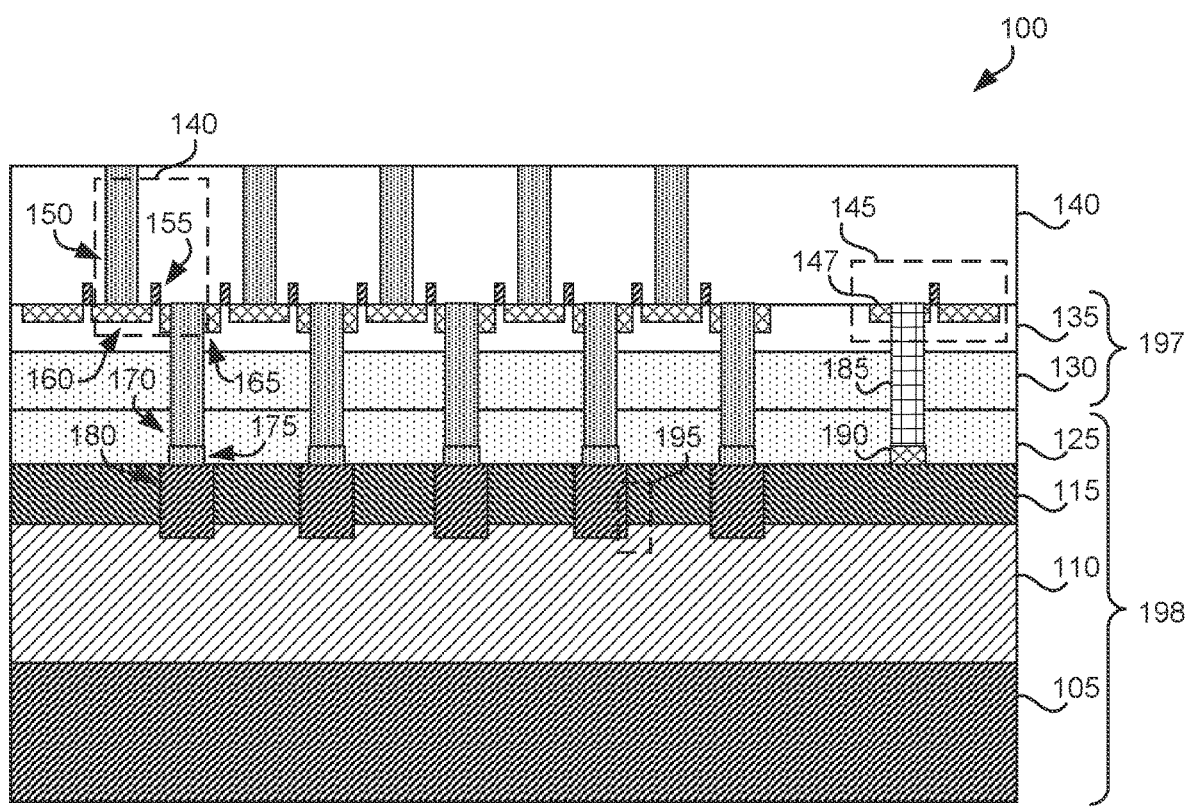
FIG. 1 depicts a cross-sectional diagram of a hybrid silicon carbide device, according to various examples.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present disclosure discusses device structures (e.g., semiconductor device structures) and techniques for forming hybrid wide band gap power devices, such as power transistors. These devices include hybrid silicon carbide devices, such as devices that include vertical silicon carbide device structures that are bonded and electrically coupled to device structures (e.g., lateral device structures) that are fabricated from other substrates, such as a silicon (Si), gallium nitride (GaN), or gallium arsenide (GaAs) substrate.

The present disclosure uses the terms switch, switching device, or switching element synonymously. A switch, switching device, or switching element can include one or more electronically-controlled switches such as an electro-mechanical switch, transistor, or other controllable semiconductor device.

As used herein, a conductivity type of a material refers to the type of the majority charge carries in the material. The conductivity types discussed herein are n-type, such as to corresponding to a majority electron charge carrier, or p-type, such as to correspond to a majority hole charge carrier. The indicator of the conductivity type of a material (e.g., "n" or "p") can include a positive sign (e.g., "+") or a negative sign (e.g., "−") to indicate a concentration of dopants or majority charge carriers in the material relative to a concentration of dopants or majority charge carriers in another material. Materials having positive conductivity type indicators have higher dopant or charge carrier concentrations than materials with negative conductivity type indicators. In an example, an n+ layer has a higher dopant concentration than an n layer, which has a higher dopant concentration than an n− layer.

The substrates, device layers, or device regions are described herein with references to specific conductivity types. It should be appreciated, however, that the conductivity type of such substrates, devices layers, or device regions can be switched to an opposite conductivity type or polarity, such as to fabricate a device with the opposite conductivity type. In an example, the conductivity type of the substrates, devices layers, or device regions of n-type MOSFETs (e.g., NMOS devices) can be inverted or switched to corresponding opposite conductivity types to fabricate p-type MOSFETs (e.g., PMOS devices).

FIG. 1 depicts a cross-sectional diagram of a hybrid silicon carbide device 100, according to various examples. The hybrid power device 100 includes a first device structure that is fabricated using silicon carbide and a second device structure that is fabricated using in another substrate. Such device structures can include one or more semiconductor device layers or regions that are formed, patterned, or processed to fabricate active or passive components of electronic circuits. The active components include transistors, diodes, and other switching or rectifying devices, while the passive components include resistors, capacitors, inductors, and the like.

In an example, the hybrid silicon carbide (SiC) device 100 includes a top device structure 197 this is fabricated using a first substrate, such as Si, GaN, GaAs, or the like. The hybrid SiC device 100 also includes a bottom device structure 198 that is fabricated using a second substrate, such as SiC. The top device structure 197 can include one or more active or passive circuit elements that conduct, switch, or rectify current during the on-state (e.g., a device conducting state) of the hybrid device 100. The bottom device structure 198 can include one or more transistor, body diode, or other SiC devices that distribute high voltages or electric fields that are applied to, or developed across, the top device structure to the silicon carbide substrate during the off-state of hybrid SiC device 100. In some examples, the bottom device structure 198 includes one or more silicon carbide power MOSFETs while the top device includes devices for interfacing with, or controlling, the power MOSFETs. Examples of such top devices include active and passive components forming gate drivers or other control circuitry.

The bottom device structure 198 includes a SiC substrate 105, such as a substrate made of an n+ monocrystalline SiC material. In some examples, the SiC substrate can be replaced by another wide band gap substrate material, such as such as diamond or gallium oxide ($Ga_2O_3$).

The bottom device structure 198 further includes an n− SiC layer 110 and a p+ SiC layer 115. In an example, the n− SiC layer 110 is disposed over a surface or face of the SiC substrate 105, while the p+ SiC layer 115 is disposed over a surface or face of the n− SiC layer. The p+ SiC layer 115 can be epitaxially formed, or grown, on the n− SiC layer 110. In some examples, the n− SiC layer 110 and the p+ SiC layer 115 forms a PN junction 195 that is usable as a body diode. The body diode can be coupled to a terminal of a device in the top device structure 197, such as a drain of a Si MOSFET, to distribute the electric field in the drain, such as while the device is turned off. The body diode can also protect the hybrid SiC device 100 from damage caused by electrostatic discharges, such as by turning on to conduct excess charge or currents to the SiC substrate 105.

The bottom device structure 198 further includes an n+ contact region 180 and a metal contact 175. The n+ contact region 180 traverses or extends through the p+ SiC layer 115 and into the n− layer 110. The metal contact 175 is formed on the n+ contact region 180 and can provide low ohmic electrical contact between the bottom device structure 198 and a circuit or circuit element in the top device, such as a gate driver circuit or circuit element.

In some examples, the bottom device structure 198 includes a second contact 190. The contact 190 can be formed on the p+ SiC layer 115 or in another layer of the bottom device, such as to provide low ohmic electrical contact between the bottom device structure 198 and control circuitry in the top device structure 197.

The top device structure 197 can include a substrate layer 135, one or more circuits or circuit elements, and a dielectric layer 130. The substrate layer 135 can include a Si, GaN, or GaAs substrate layer that is formed (e.g., grown, implanted, or deposited) on the insulator layer 130. The one or more circuits or circuit elements include active or passive components, such as transistors, resistors, capacitors, or inductors. In some examples, the circuit elements include a MOSFET 140 having source 160, gate 155, and drain 165. The drain of the MOSFET 140 can be connected to the bottom device structure 198 through the contact 170 (e.g., a drain contact) and 175. In certain examples, the MOSFET 140 is an element of a gate driver circuit that is configured to actuate a power device (e.g., a transistor) included in the bottom device structure 198. The circuit elements can also include a control element 145 (e.g., a passive device or an active device, such as another MOSFET) that is usable for forming a control circuit for controlling the operation of the hybrid SiC device 100. The control element 145 can include one or more MOSFETs or other active devices that are connected to the bottom device structure 198 through contact 185 and 190.

The hybrid SiC device 100 is formed by bonding the top device structure 197 and the bottom device structure 198 at one or more bonding layer, such as dielectric layers 130 and 125. A passivation layer 140 and one or more source contacts 150 can be added, such as to provide electrical contact to elements of the hybrid device.

In some examples, the hybrid device 100 includes additional layers, device structures, and device regions that are not depicted in FIG. 1. In an example, the bottom device structure 198 can include a drain contact on the bottom-side of the SiC substrate 105 and a gate device structure (e.g., a dielectric and a metal contact) on the p+ SiC layer 115 to form one or more vertical transistors. In other examples the top device structure includes one or more additional contacts that provide electrical connection to the base or drain of the MOSFET 140, or to terminal regions of the control element 145.

Device structures and process steps for obtaining, or fabricating, the hybrid SiC device 100 will now be discussed with reference to FIGS. 2A-4C.

Figure 2A:
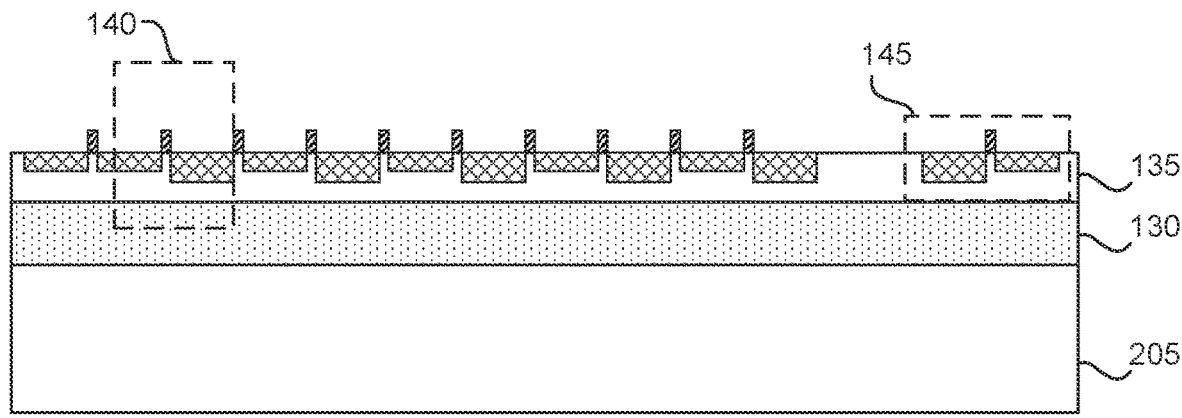
FIGS. 2A-2C depict semiconductor structures that correspond to process steps for obtaining, or fabricating, a top device structure of a hybrid silicon carbide device, according to various examples.
Figure 2B:
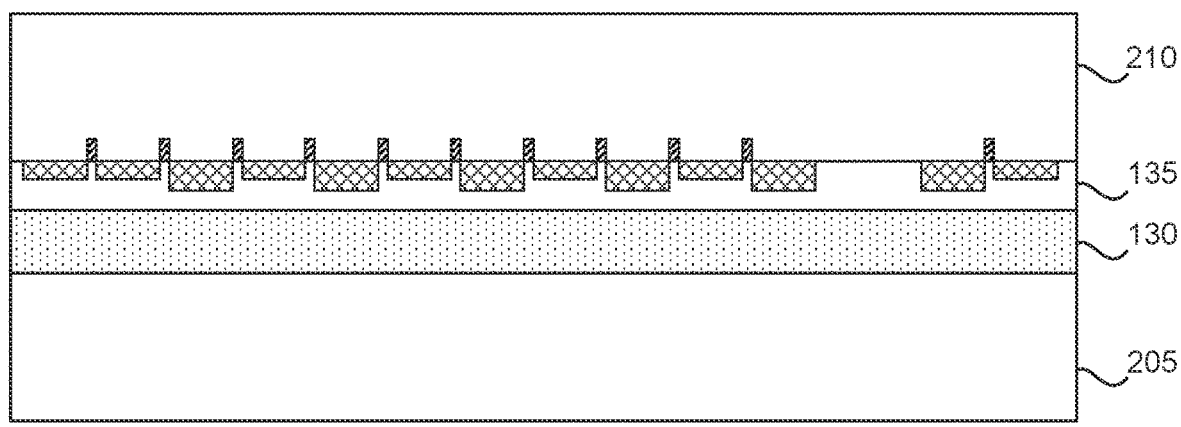
Figure 2C:
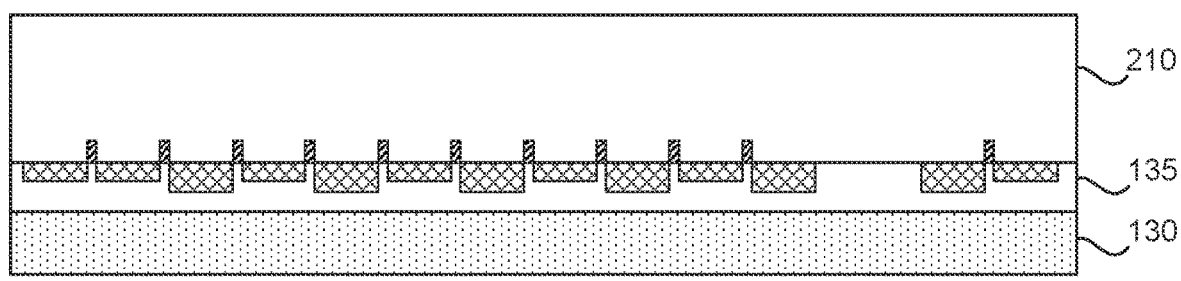

FIGS. 2A-2C depict semiconductor structures that correspond to process steps for obtaining, or fabricating, a top device structure of a hybrid silicon carbide device, according to various examples. As shown in FIG. 2A, obtaining the top device structure 197 includes forming the dielectric layer 130 on a source wafer substrate 205, such as by growing a layer silicon oxide on silicon substrate. The source wafer substrate 205 can include any suitable semiconductor substrate that can serve as a source wafer for forming the dielectric layer 130 and for growing or forming the device substrate layer 135. Obtaining the top device structure further includes forming the device substrate layer 135 on the dielectric layer 130. The device substrate layer 135 can be formed by epitaxial growth of a thin layer, or region, of Si, GaN, GaAs, or other substrate material on a buffer or insulator layer, such as the dielectric layer 130. Examples of techniques for forming the substrate layer 135 are described in U.S. Pat. No. 5,258,318 to Buti which discusses forming SOI BiCMOS integrated circuits. Other examples of techniques for forming the substrate layer 135 can be found in U.S. Pat. Pub. No. US20060073621A1 to Michael Kneissel which discusses forming Group III-nitride based HEMT device in insulating GaN/AlGaN buffer layer. Obtaining the top device structure 197 additionally includes forming one or more active or passive devices, such as MOSFET 140 and control element 145, using the substrate layer 135.

FIG. 2B and FIG. 2C illustrate device structures associated with process steps for separating the top device structure from the wafer substrate 205. Such steps can include attaching a carrier wafer 210 to the top device structure, such as shown in FIG. 2B, and processing the resulting structure to separate the top device structure from the wafer substrate 205. In some examples, a grind-back or SEZ substrate etching technique is used to remove the substrate wafer 205 to form the top device and carrier wafer structure shown in FIG. 2C.

FIG. 3A-3E illustrates device structures associated with process steps for obtaining, or fabricating, a bottom device structure (e.g., a SiC device structure) of the hybrid SiC device 100.

Figure 3A:
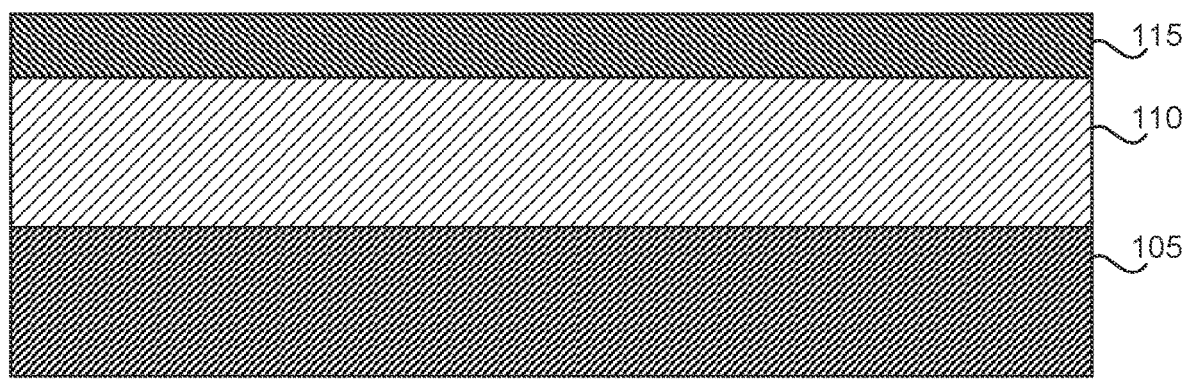
FIG. 3A-3E depict semiconductor structures that correspond to process steps for obtaining, or fabricating, a silicon carbide device structure of a hybrid silicon carbide device, according to various examples.

The process for forming the bottom device structure can include obtaining the device structure shown in FIG. 3A. Such device structure can include a SiC substrate layer 105, a first SiC layer 110, and a second SiC layer 115. In an example, the SiC layer 105 is a n-type monocrystalline SiC layer having a first concentration of n-type dopants (hereinafter, "n+ layer"), the first SiC layer 110 is an n-type layer having a second concentration of n-type dopants (hereinafter, "n− layer"), and the second SiC layer is a p-type layer (hereinafter, "p+ layer"). In certain examples, the first concentration of n-type dopants is larger than the second concentration of n-type dopants. The doped layers are at least partially electrically activated, such as by using an annealing process. In some examples, the n− layer (e.g., a drift layer) is formed on, or in, the n+ layer by epitaxial growth and the p+ layer is epitaxially formed on, or in, the n− layer by ion implantation using, for example, boron ions. In some examples, both the n− and the p+ layers are formed by ion implantation. The thickness of the n− or the p+ layers can be selected according to a desired electrical characteristic (e.g., a maximum breakdown voltage or voltage resilience characteristics) of the hybrid device 100.

Figure 3B:
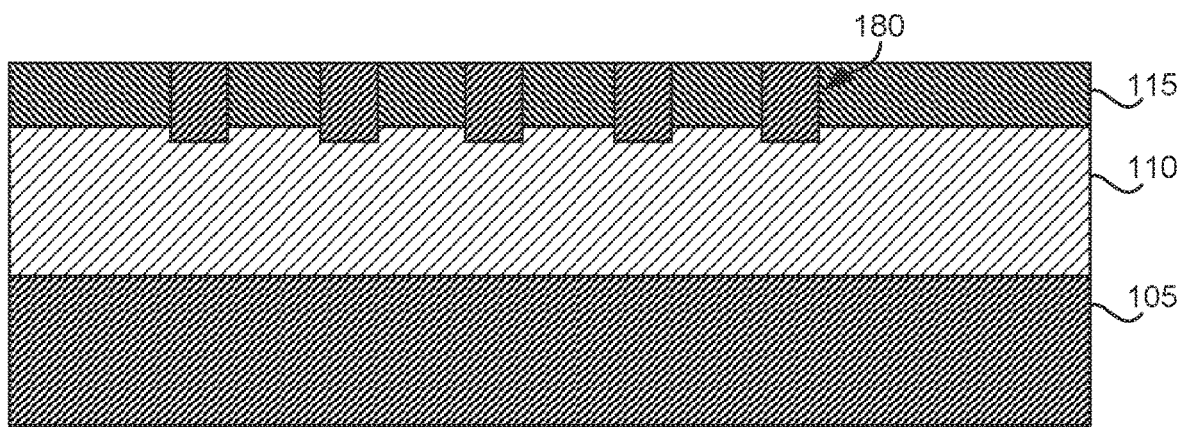

The process for forming the bottom device structure 198 can also include obtaining the device structure shown in FIG. 3B, such as by forming a conductive n+ region 180. The n+ region can be formed by patterning a mask on the p+ layer and using the mask and an ion implantation process to implant n-type impurities or ions, such as phosphorous, in the p+ layer and the n− layer. The implanted ions can then be electrically activated using an annealing process. As shown in FIG. 3B, the n+ region 180 extends from a top surface, or face, of the p+ layer, through a bottom surface of the p+ layer and partially into the n− layer. In some examples, the n+ region 180 is an n-type contact region.

Figure 3C:
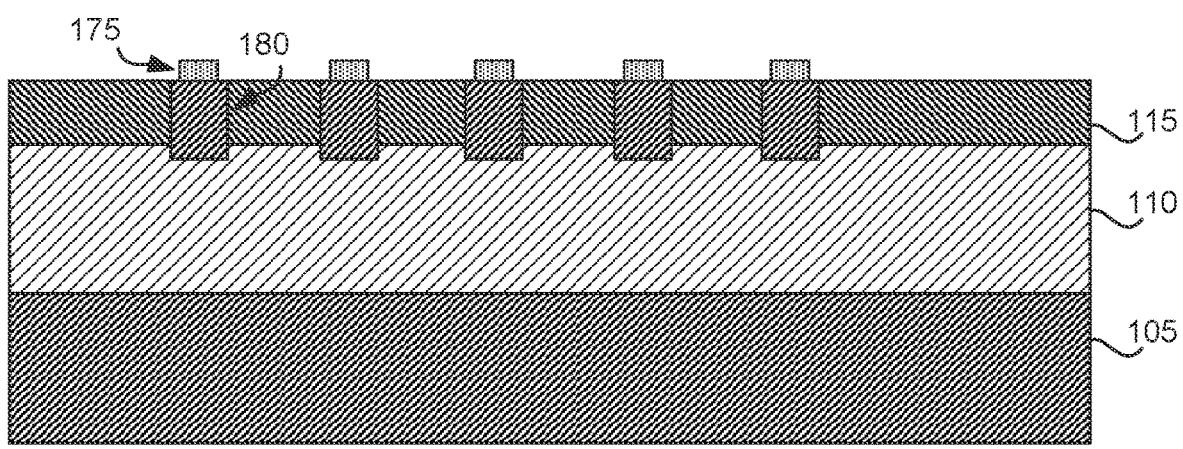

The process for forming the bottom device structure can further include obtaining the device structure shown in FIG. 3C, such as by forming a metal contact area 175 on the n+ region 180. The metal contact area can be formed by depositing a metal, such as nickel, over the p+ layer and the n+ region 180. The deposited metal can then be patterned, annealed, and stripped to form the contact area 175.

Figure 3D:
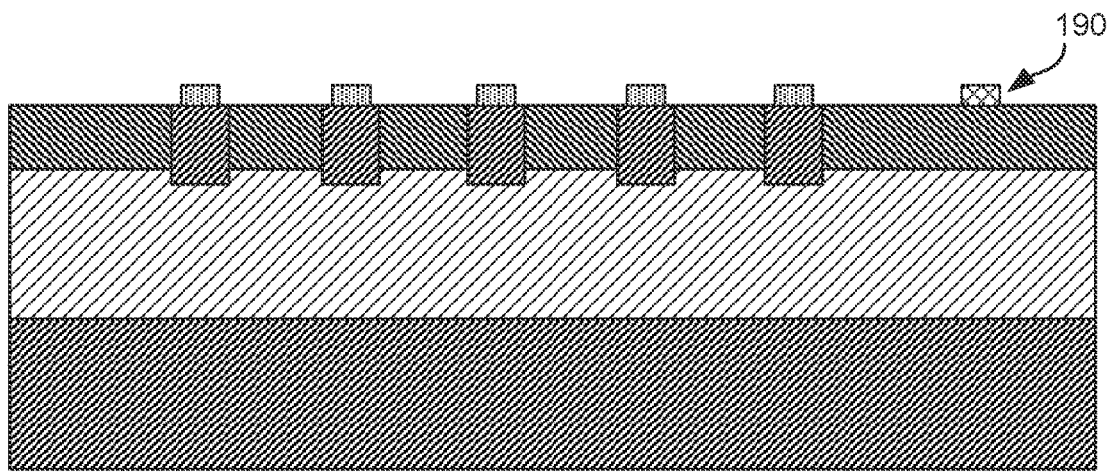

In some examples, the process for forming the bottom device structure 198 further includes obtaining the device structure shown in FIG. 3D, such as by forming a p-type SiC contact 190 (e.g., a p-SiC contact) on the p+ layer. The p-SiC contact 190 can be formed by depositing, patterning and annealing a metal, such as an aluminium based metal.

Figure 3E:
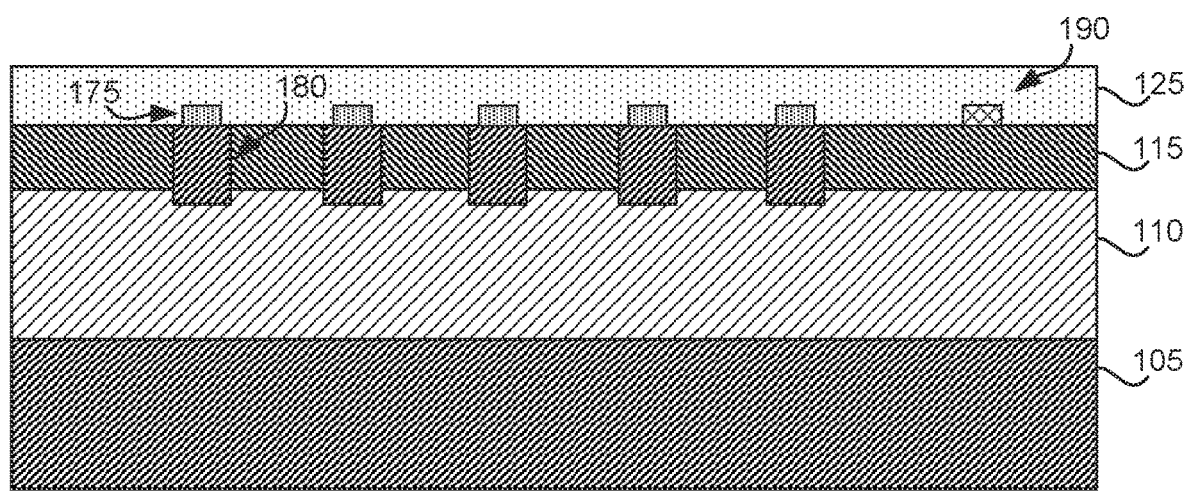

The process for forming the bottom device structure 198 can additionally include obtaining the device structure shown in FIG. 3E, such as by forming the dielectric or passivation layer 125. In some examples, the dielectric layer 125 is formed by depositing a dielectric material, such as silicon dioxide ($SiO_2$), over the p+ layer, the n+ region 180, the metal contact area 175, and the p-SiC contact 190. The dielectric material can then be planarized or otherwise processed for bonding with the top device structure 197.

Figure 4A:
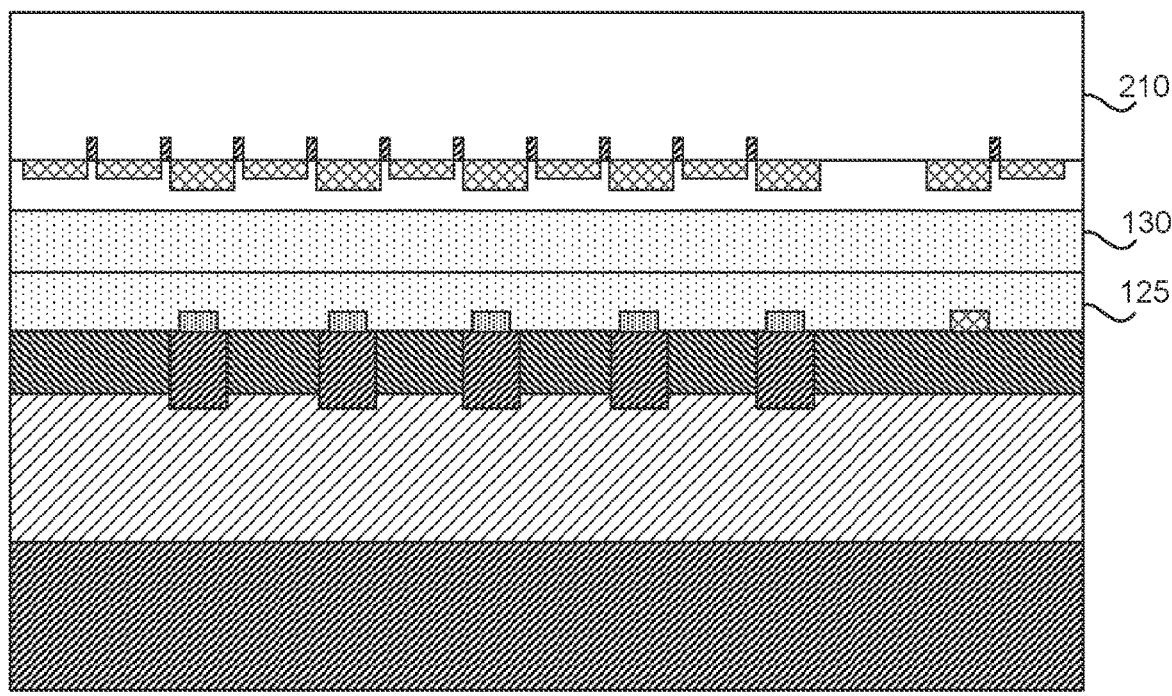
FIG. 4A-4C depict semiconductor structures that correspond to process steps for bonding a silicon carbide device structure with a device structure that is fabricated from another substrate material to form a hybrid silicon carbide device, according to various examples.
Figure 4B:
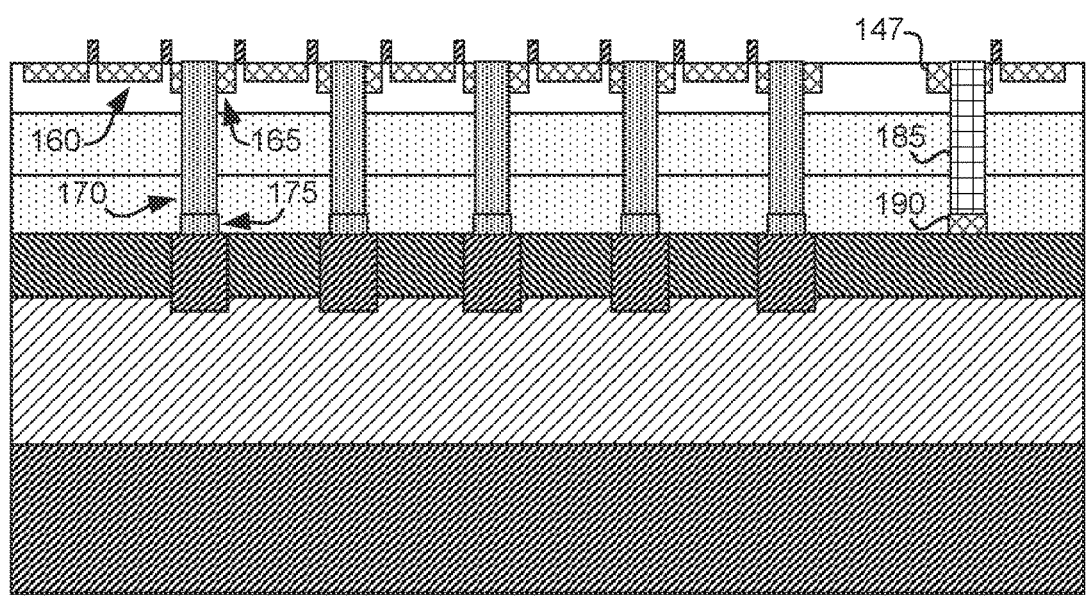
Figure 4C:
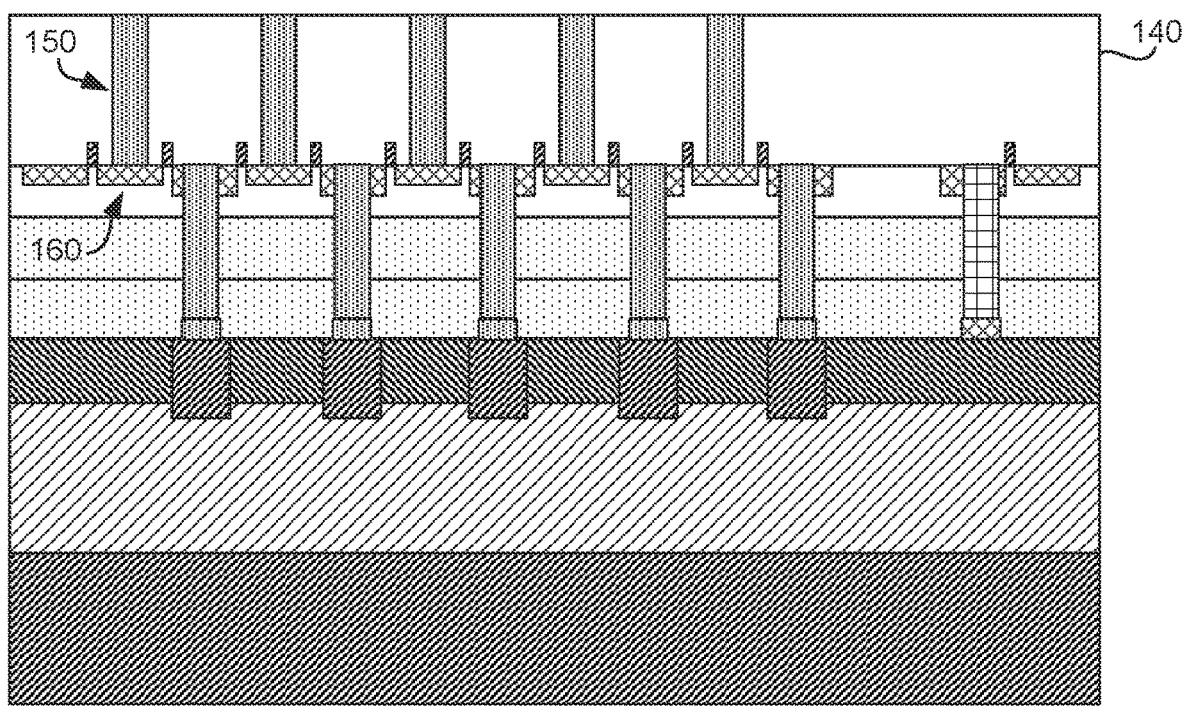

FIG. 4A-4C illustrates device structures associated with process steps for bonding a SiC device structure (e.g., the bottom device structure 198) with another device structure (e.g., the top device structure 197) that is fabricated from another substrate material to form the hybrid device 100. As shown in FIG. 4A, the carrier wafer 210 can be used to bond the dielectric layer 130 of the top device structure 197 to the dielectric layer 125 of the bottom device structure 198. The dielectric layers can be bonded using any suitable bonding technique, such as by using a direct or fusion bonding technique.

After bonding the top device structure 197 and the bottom device structure 198, the carrier wafer 210 is removed and the one or more electrical contacts are made between circuits, device elements, or structures in the top device structure and in the bottom device structure, As shown in FIG. 4B. forming such electrical contacts can include forming, such as by etching, one or more vias from the front side of the top device structure 197 to contact or expose the metal contact area 175 or the p-type SiC contact 190. In some examples, electrical contact is formed between a drain terminal 165 of a MOSFET transistor formed in the top device structure 197 and the bottom device structure 198 by etching a via through the drain terminal to the metal contact area 175 and filling the via with a metal, such as nickel, to form the contact 170. The contact 170 can provide an electrical path for conducting excess charge at the drain terminal 165 to the n− and n+ layers of the bottom device structure 198, thereby increasing the resilience of the hybrid SiC device 100 to voltage stress. In another example, electrical contact between a source terminal 147 of a MOSFET transistor (e.g., a control device or transistor) formed in the top device structure and the bottom device structure by etching a via through the source terminal to the p-type SiC contact 190 and filling the via with a metal, such an aluminium based metal, to form the contact 185. In some examples the contact 185 or the source 147 is grounded.

As shown in FIG. 4C, the process for forming the hybrid device 100 further include forming a passivation or dielectric layer 140 and forming a contact 150 through the passivation layer to the top device structure. In an example the contact 150 is formed by forming a via in the passivation layer to expose an area of the top device structure, such as a source terminal of a MOSFET transistor, and filling the via with a metal, such as nickel.

Figure 5:
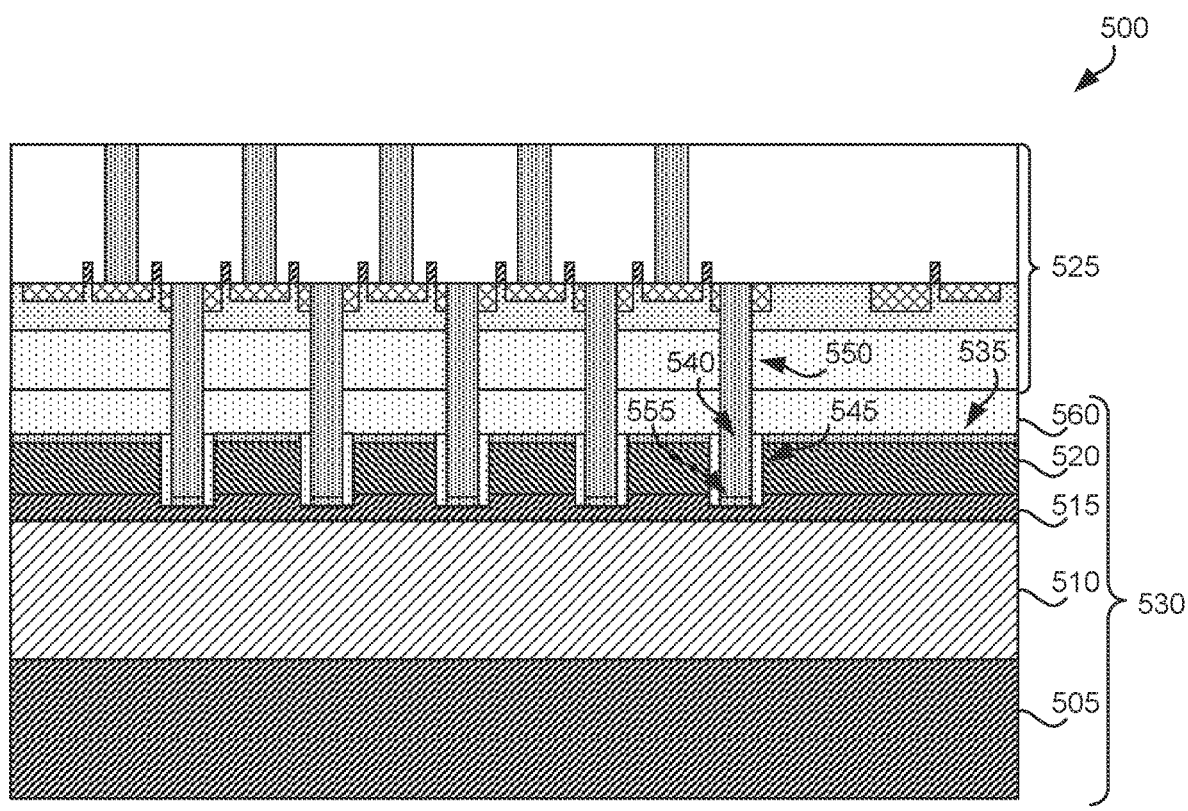
FIG. 5 depicts a cross-sectional diagram of a hybrid silicon carbide power device, according to various examples.

FIG. 5 depicts a cross-sectional diagram of a hybrid SiC device 500, according to various examples. The hybrid power device 500 is an example of an alternate device structure for the hybrid SiC device 100 (FIG. 1). The hybrid SiC device 500 includes a top device structure 525 and a bottom device structure 530. The top device structure 525 can be an example of the top device structure 197 and may be obtained, or formed, using process steps that are substantially similar to the process steps used to obtain the top structure 197. The bottom device structure 530 is a SiC device structure that is substantially similar to the SiC device structure described in FIG. 1. The bottom device structure 530, however, is modified to include an additional n+ SiC layer and a thinner p+ layer, as compared to SiC discussed in FIG. 1. In an example, the bottom device structure 5 includes an n+ SiC substrate 505, an n− SiC layer 510 (hereinafter, "n− layer 510"), an n+ SiC layer 515 (hereinafter, "n+ layer 515"), and a p+ SiC layer 520 (hereinafter, "p+ layer 520"), and passivation layer 560. The bottom device structure 530 can also include a metal layer 535, such as layer of nickel silicide, that is formed on a top surface of the p+ layer 520 and as a metal deposit 555 (e.g., a contact region) at the bottom of a cavity 540 formed in the p+ layer and the n+ layer 515. The side walls of the cavity 540 are covered by an oxide region 545 that extends from the bottom of the cavity 540 to a top surface of the metal layer 535. The top device structure 525 and the bottom device structure 530 of the hybrid device 500 are electrically connected by one or more contacts 550 that extend from a top surface of the front-side of the top device structure into the cavity 540 to contact the deposit of metal 555.

FIGS. 6A-7C depict semiconductor structures that correspond steps of a process for fabricating the hybrid SiC device 500.

Figure 6A:
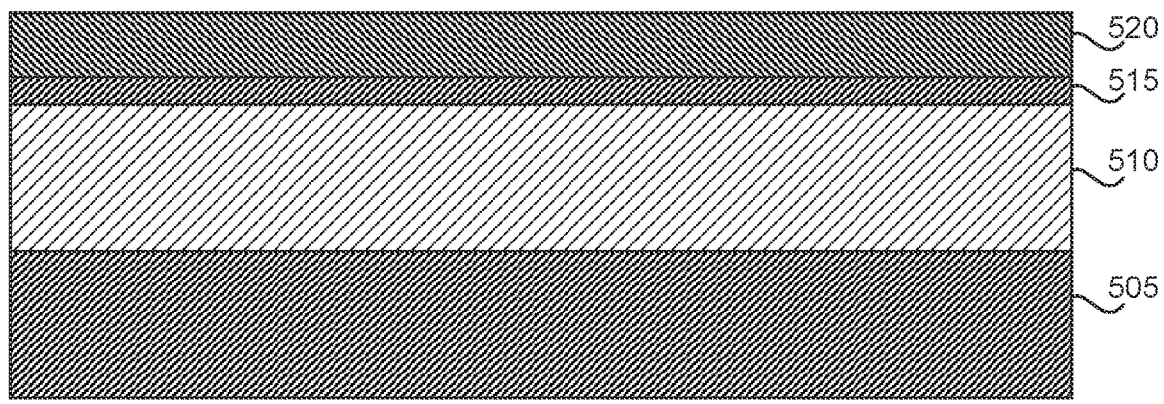
FIGS. 6A-6E depict semiconductor structures that correspond to process steps for fabricating a hybrid silicon carbide power device, according to various examples.

The process for fabricating the hybrid SiC device 500 includes obtaining the bottom device structure 530, such as by forming the SiC structure shown in FIG. 6A. In some examples, the SiC structure depicted in FIG. 6A includes the n+ SiC substrate 505, the n− layer 510, the n+ layer 515, and a p+ layer 520 and can formed using any suitable SiC substrate processing technique.

Figure 6B:
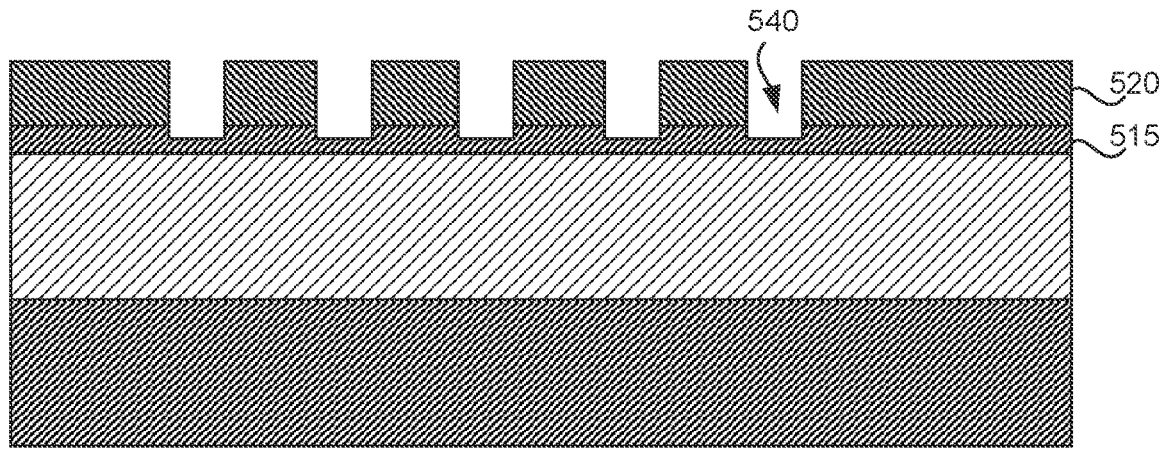

The device structure shown in FIG. 6B can be obtained by forming, such as by etching, a cavity 540 that extends through the p+ layer 520 and into a portion of the n+ layer 515.

Figure 6C:
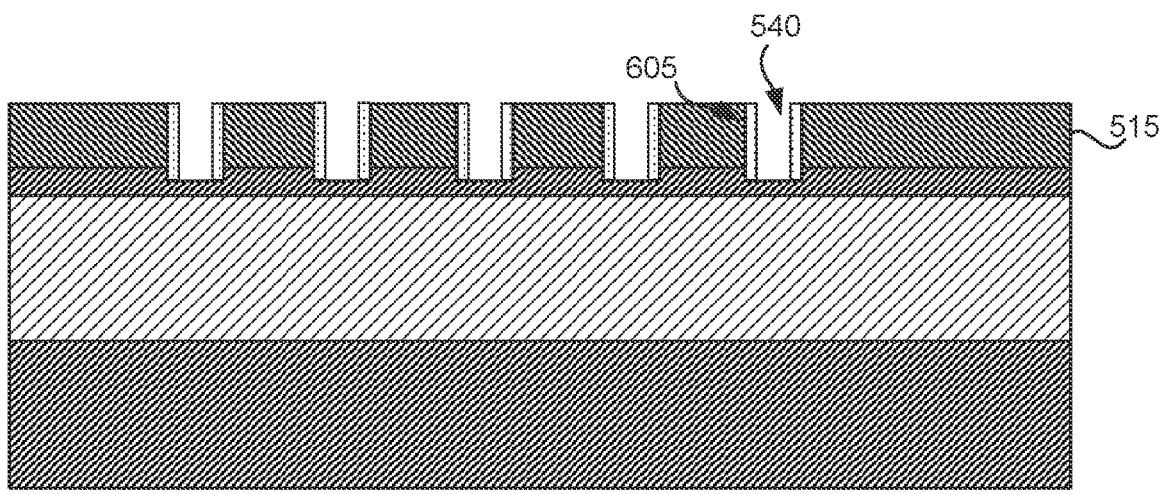

The device structure shown in FIG. 6C can be obtained by forming, such as by growing, a region of oxide material on the side-walls and in the bottom of the cavity 540. Oxide material that develops in the bottom of the cavity 540 or on the surface of the p+ layer 520 can be etched to form oxide spacer 605 that cover sidewalls of the cavity.

Figure 6D:
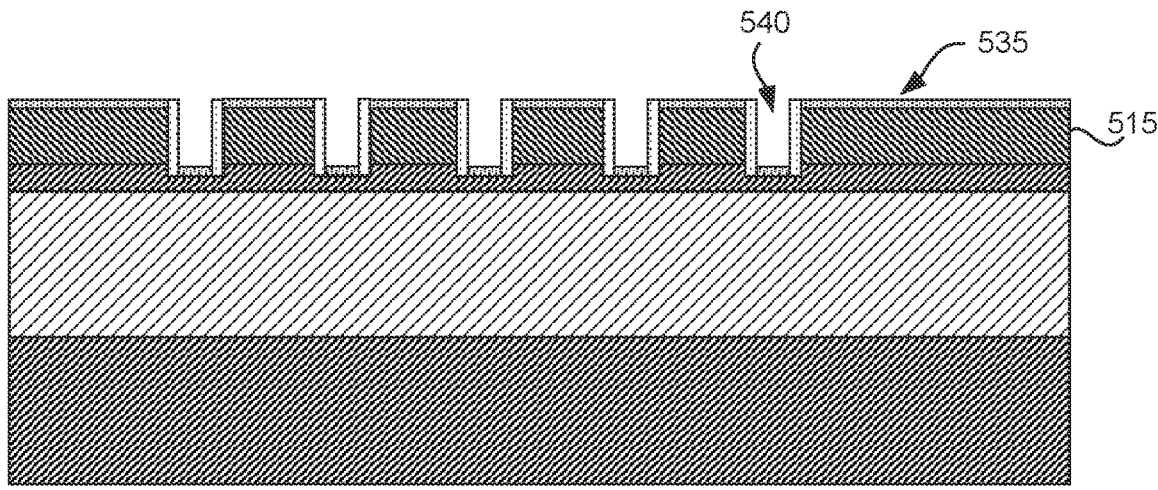
Figure 6E:
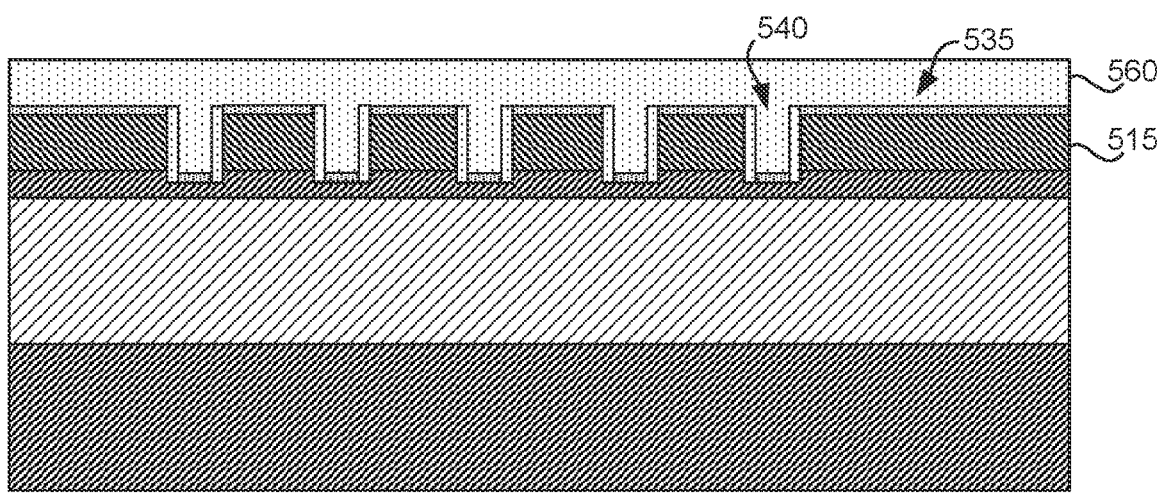

The device structure shown in FIG. 6D can be obtained by depositing a metal material, such as nickel, over the exposed surface of the p+ layer 520 and in the bottom of the cavity 540, such that the metal deposits in the cavity are electrically isolated from the metal deposits on the surface of the p+ layer. In some examples, the deposited metal is annealed, and stripped, such as to form a layer of nickel silicide (e.g., metal layer 535). The nickel silicide can be self-aligned to, and form an electrical contact with, the n+ and p+ regions of the device structure.

The device structure shown in FIG. 6D can be obtained by forming a passivation or dielectric layer 560 over the nickel silicide layer, the oxide spacers 605 and into the cavity 540.

Figure 7A:
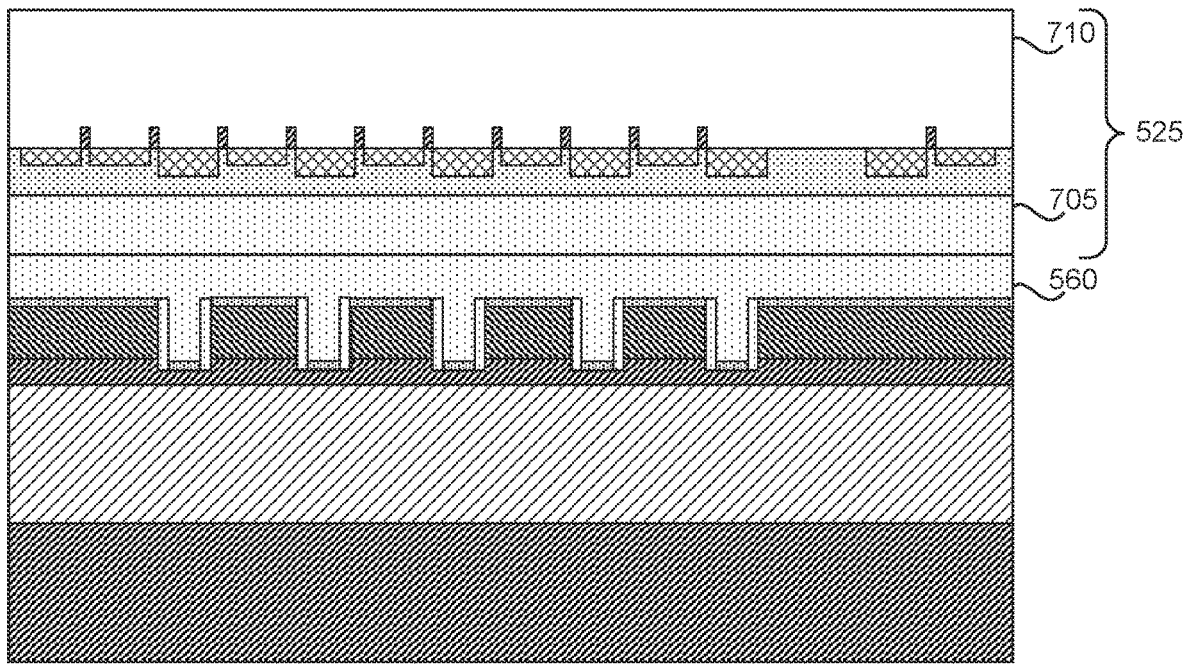
FIG. 7A-7C depict semiconductor structures that correspond to process steps for bonding devices structures to form a hybrid silicon carbide power device, according to various examples.
Figure 7B:
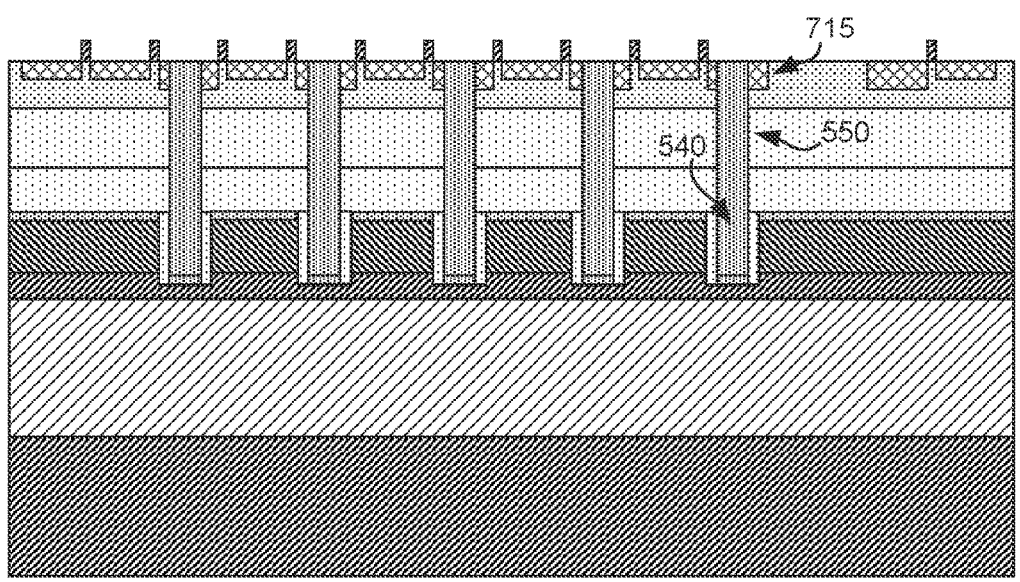

FIG. 7A-7B depict device structures that correspond to process steps for bonding the top device structure 525 to the bottom device structure 530. As shown in FIG. 7A, the carrier wafer 710 can be used to bond the dielectric layer 705 of the top device structure 525 to the dielectric layer 560 of the bottom device structure 530. The device structure shown in FIG. 7B can then be obtained by removing the carrier wafer 710 and forming one or more electrical contacts between the top device structure 525 and the bottom device structure 530, as described herein. In an example, electrical contact 550 is formed between a drain terminal 715 of a MOSFET transistor formed in the top device structure and the bottom device structure by etching a via through the drain terminal to the metal deposit (e.g., the nickel silicide deposition) in the cavity 540 and filling the via with a metal, such as nickel.

Figure 7C:
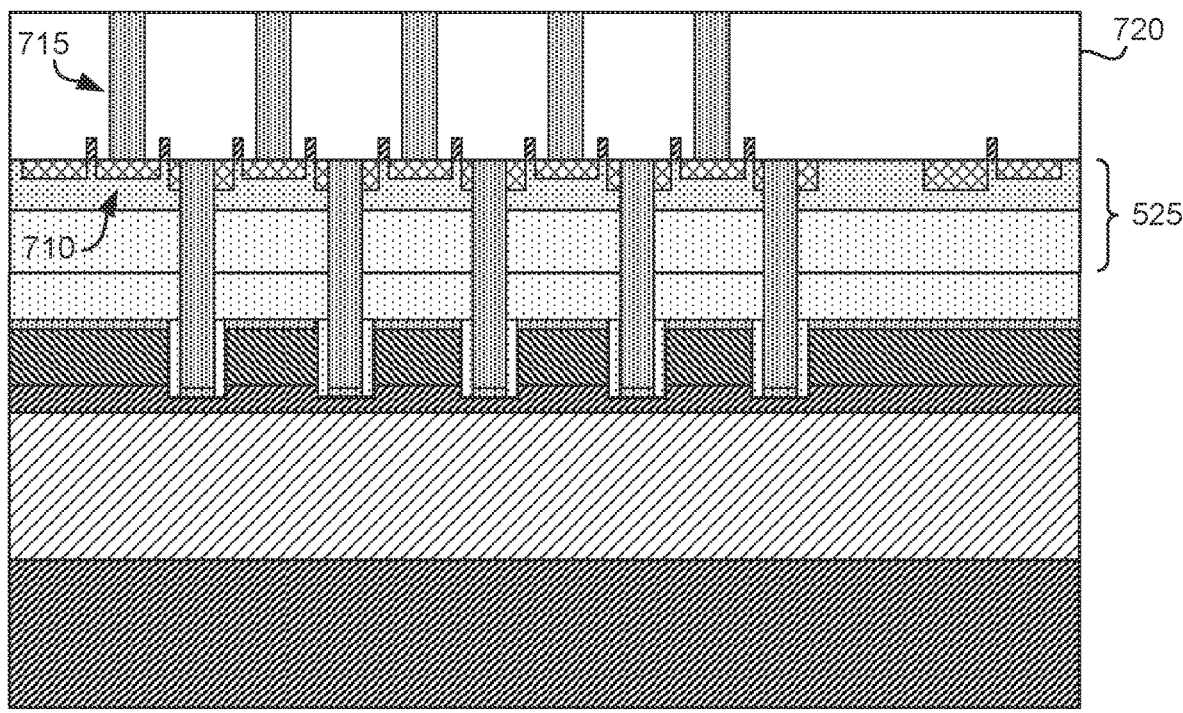

The device structure shown in FIG. 7C can be obtained by forming a passivation or dielectric layer 720 and forming a contact 715 through the passivation layer to the top device structure 525. In an example the contact 715 is formed by forming a via in the passivation layer to expose an area of the top device structure, such as a source terminal 715 of a MOSFET transistor, and filling the via with a metal, such as nickel.

Figure 8:
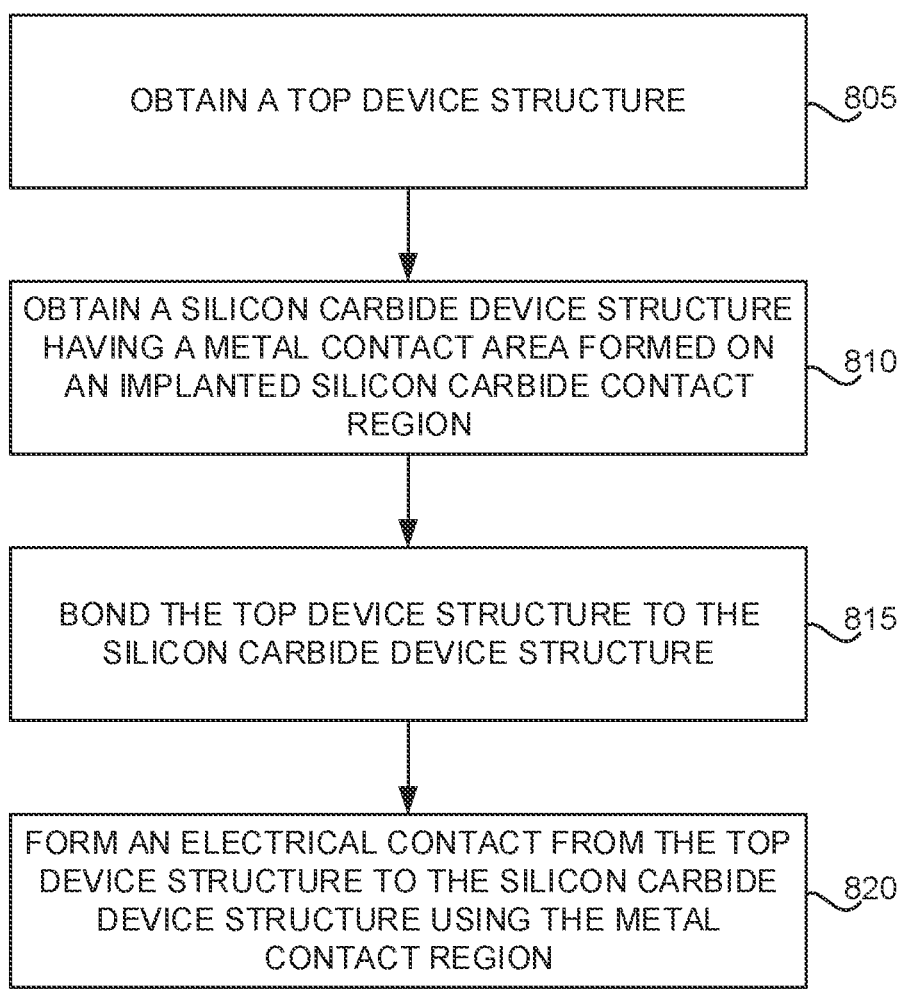
FIG. 8 depicts a set of operations of a process for fabricating a hybrid silicon carbide device, according to various examples.

FIG. 8 depicts a set of operations for a process 800 for fabricating a hybrid SiC device, such as the hybrid power device 100 (FIG. 1). The process 800 can be included in a SiC fabrication process to fabricate devices that include both SiC device structures and device structures formed using other semiconductor substrates, such as Si, GaN, or GaAs. Such devices can include power switching devices that have active switching or control circuit elements (e.g., transistors, diodes, resistors, capacitors, inductors, and other active of passive elements) in the first device structure that is fabricated using a first substrate, such as Si, and field management or power dissipation elements in a second device structure that is fabricated using a second substrate, such as SiC.

At 805, a top device structure (e.g., a first device structure), such as device structure that includes one or more circuit elements that are formed using a first substrate, is obtained. The top device structure can be obtained (e.g., formed, fabricated, or developed) using a fabrication process that is the same as, or that is different from, the fabrication process used to fabricate the hybrid SiC device. In some examples, the top device structure is obtained as a whole wafer while in other examples the top device structure is obtained as one or more singulated die. In some examples, the top device structure includes a first substrate layer, such as a layer of Si, GaN, or GaAs that was formed on a layer of passivation material that is disposed over a device or source wafer. Such top device structure can also include one or more transistors formed on a front side of a first region or surface of the substrate layer. In an example, the one or more transistors include a MOSFET having a source, gate, and a drain region. In other examples, the one or more transistors have a different structure, or are fabricated using a different technology, and includes equivalent regions. In certain examples, obtaining the top device structure includes forming the one or more transistors using the substrate layer, bonding the device structure to a carrier wafer; and removing the source wafer, as described herein.

At 810, a bottom device structure (e.g., a SiC device structure), such as a device structure that has a metal contact area formed on an implanted silicon carbide contact region, is obtained. The bottom device structure can include a second substrate layer that has a first conductivity type, such as an n+ SiC wafer or an n+ layer of SiC material. The bottom device structure can also include a first SiC layer having the first conductivity type, a second SiC layer having a second conductivity type, and a first contact region having the first conductivity type, where the first contact region traverses the second SiC layer and contacts the first SiC layer. In some examples, obtaining the second device structure includes forming the first contact region in the second SiC layer and at least partially in the first SiC layer. Obtaining the second device structure can further include forming a second contact in the first contact region or forming a third contact region on the second silicon carbide layer.

In some examples, forming the first contact region includes forming an ion implantation mask on the second SiC layer, where the ion implantation mask includes an opening that corresponds to a location of first contact region. Forming the first contact region can further include implanting dopants of the first conductivity type into the first SiC layer and the second SiC layer using the ion implantation mask and activating the dopants, such as by heating the first or second SiC layer.

In some examples, forming the second contact in the contact region includes forming a mask comprising openings that correspond to a location and geometry of the second contact, depositing a metal (e.g., nickel) in the openings, annealing the metal, and removing the mask.

At 815, the top device structure is bonded to the bottom device structure. Such bonding can include bonding a passivation layer on the back-side of the top device structure to a passivation layer on the front-side of the bottom device structure, as described herein.

At 820, one or more contacts can be formed to couple the drain region, or other terminal region, of the one or more transistors to the contact regions though a back-side of the first substrate layer.

Figure 9:
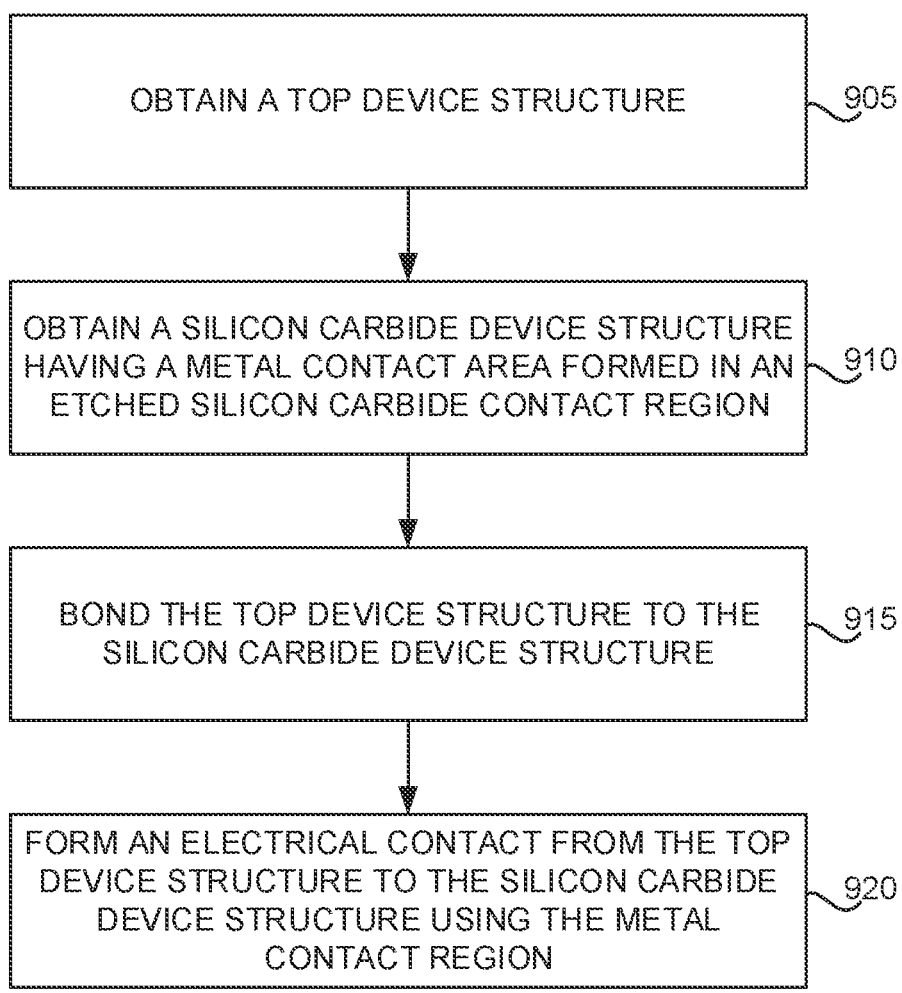
FIG. 9 depicts a set of operations of another process for fabricating a hybrid silicon carbide device, according to various examples.

FIG. 9 depicts a set of operations for another process 900 for fabricating a hybrid SiC device, such as the hybrid power device 500 (FIG. 5). At 905, a first device structure is obtained, as described herein. At 910, a SiC device structure is obtained. The SiC device structure includes a SiC substrate layer having a first conductivity type and a first SiC layer that has the first conductivity type and which is formed on a surface of the first substrate layer. The SiC device structure also includes a second SiC layer that has the first conductivity type, where the second SiC layer is formed on a surface of the first SiC layer. The SiC device structure additionally includes a third SiC layer of a second conductivity type, where the third SiC layer formed on a face of the second SiC layer. The SiC device structure further includes a contact region that comprises a cavity that extends from a surface of the third SiC layer to contact the third SiC layer.

In some examples, obtaining the second device structure includes forming the cavity by etching through the third silicon carbide layer and at least partially into the second silicon carbide layer, forming an oxide region on the side walls of the cavity, and forming a metal layer on the third silicon carbide layer and in the cavity. In certain examples, the metal layer is a layer of nickel, and obtaining the second device structure further includes heating the nickel device structure to form nickel silicide and forming a dielectric layer on the metal layer (e.g., the nickel silicide layer) and the oxide region followed by planarizing the dielectric layer.

At 915, the first device structure is bonded to the second device structure at a dielectric layer, as described herein.

At 920, one or more contacts that traverse a first terminal region of the switching device and the contact region contact the third device structure.

Various examples of the present disclosure are described below.

Example 1 is a hybrid silicon carbide device for switching an electrical signal, the device comprising: a first device structure comprising: a first substrate comprising silicon carbide of a first conductivity type; a first silicon carbide layer of the first conductivity type, the first silicon carbide layer formed on a face of the first substrate; a second silicon carbide layer of a second conductivity type, the second silicon carbide layer formed on a face of the first silicon carbide layer; and a first contact region of the first conductivity type, the first contact region traverses the second silicon carbide layer and contacts the first silicon carbide; a second device structure that is bonded to the first device structure, the second device structure comprising: a switching device formed on a second substrate; and a second contact region that traverses a first terminal region of the switching device and contacts the first contact region.

In Example 2, the subject matter of Example 1 includes, wherein the first device structure comprises a SiC transistor.

In Example 3, the subject matter of Example 2 includes, wherein the switching device comprises at least one of a silicon transistor, a gallium nitride transistor, or a gallium arsenide transistor.

In Example 4, the subject matter of Example 3 includes, wherein the gallium nitride device is a high electron mobility transistor.

In Example 5, the subject matter of Examples 3-4 includes, wherein the silicon transistor is at least one of a junction field effect transistor or a metal oxide semiconductor field effect transistor.

In Example 6, the subject matter of Examples 1-5 includes, wherein the first device structure comprises an interface region that is connected to the first contract region and the second contact region.

In Example 7, the subject matter of Examples 1-6 includes, wherein at least one of the first contact region, the second contact region, or the third contact region comprises nickel.

In Example 8, the subject matter of Examples 1-7 includes, wherein the second device structure comprises one or more control devices, the control devices configured to actuate the first device structure and the second device structure.

In Example 9, the subject matter of Example 8 includes, wherein the control device comprises at least one switching element formed using the second substrate.

In Example 10, the subject matter of Examples 8-9 includes, wherein the control device comprises at least one passive component, the at least one passive component formed using the second substrate.

In Example 11, the subject matter of Examples 8-10 includes, wherein the control circuitry is coupled to the first substrate.

In Example 12, the subject matter of Examples 1-11 includes, wherein the first device structure is bonded to the second device structure using a dielectric layer.

In Example 13, the subject matter of Examples 1-12 includes, wherein a front side of the first structure is bonded to the back side of the second device structure through the dielectric layer.

In Example 14, the subject matter of Examples 1-13 includes, wherein the second substrate comprises silicon, gallium nitride, or gallium arsenide.

In Example 15, the subject matter of Examples 1-14 includes, wherein the first conductivity type is n-type and the second conductivity type is p-type.

In Example 16, the subject matter of Examples 1-15 includes, wherein hybrid silicon carbide device is configured to conduct an electric current from the first terminal region through a P-N junction to first substrate, the P-N junction formed by the first contact and the first silicon carbide layer.

In Example 17, the subject matter of Examples 1-16 includes, wherein the first silicon carbide layer has a lower charge carrier concentration than a charge carrier concentration of the first substrate.

In Example 18, the subject matter of Examples 1-17 includes, wherein the second substrate is epitaxially formed on a first wafer.

Example 19 is a silicon carbide device to switch an electrical signal, the device comprising: a first structure comprising: a first substrate layer comprising silicon carbide of a first conductivity type; a first silicon carbide layer of the first conductivity type, the first silicon carbide layer formed on a surface of the first substrate layer; a second silicon carbide layer of first conductivity type, the second silicon carbide layer formed on a surface of the first silicon carbide layer; a third silicon carbide layer of a second conductivity type, the third silicon carbide layer formed on a face of the second silicon carbide layer; and a contact region that comprises a cavity that extends from a surface of the third silicon carbide layer to contact the third silicon carbide layer; and a second device structure that is bonded to the first device structure, the second structure comprising: a switching device formed on a second substrate; and a contact that traverses a first terminal region of the switching device and the contact region to contact the third device structure.

In Example 20, the subject matter of Example 19 includes, wherein a sidewall of the cavity comprises a silicon oxide region.

In Example 21, the subject matter of Examples 19-20 includes, wherein the contact comprises nickel.

In Example 22, the subject matter of Examples 19-21 includes, wherein: the first silicon carbide layer has a first charge carrier concentration; the second silicon carbide layer has a second charge carrier concentration; and the third silicon carbide layer has a third charge carrier concentration.

In Example 23, the subject matter of Examples 19-22 includes, wherein the first structure comprises a silicon carbide transistor that is disposed vertically under the second structure.

In Example 24, the subject matter of Example 23 includes, wherein the second structure comprises at least one of a JFET, a MOSFET, or a HEMT.

In Example 25, the subject matter of Examples 23-24 includes, wherein the second structure comprises control circuitry to controllably actuate a transistor in the first device structure or a transistor in the second device structure.

In Example 26, the subject matter of Examples 19-25 includes, wherein the first structure comprises a layer of nickel disposed on the surface of the fourth silicon carbide layer or in the cavity.

In Example 27, the subject matter of Examples 19-26 includes, wherein the first conductivity type is n-type and the second conductivity type is p-type.

Example 28 is a method of fabricating a hybrid silicon carbide switching device, the method comprising: obtaining a first device structure, the first device structure comprising: a first substrate layer; a first transistor formed on a front side of the first substrate layer, the first transistor comprising a source region, a gate region, and a drain region; obtaining a second device structure, the second device structure comprising: a second substrate layer comprising silicon carbide of a first conductivity type; a first silicon carbide layer of the first conductivity type; a second silicon carbide layer of a second conductivity type; and a first contact region of the first conductivity type, the first contact region traversing the second silicon carbide layer and contacting the first silicon carbide layer; bonding the first device structure to the second device structure at a dielectric layer; and forming a first contact to couple the drain region to the first contact region though a back-side of the first substrate layer.

In Example 29, the subject matter of Example 28 includes, wherein obtaining the first device structure comprises: forming the first transistor in the first substrate layer, the first substrate layer being formed on a passivation layer on a first wafer; bonding the device structure to a to a second wafer; and removing the first wafer from the device structure.

In Example 30, the subject matter of Examples 28-29 includes, wherein obtaining the second device structure comprises: forming the first contact region in the second silicon carbide layer and at least partially in the first silicon carbide layer; and forming a second contact in the contact region.

In Example 31, the subject matter of Example 30 includes, wherein forming the first contact region comprises: forming an ion implantation mask on the second silicon carbide layer, the ion implantation mask comprising an opening that corresponds to a location of first contact region; implanting dopants of the first conductivity type into the first silicon carbide layer and the second silicon carbide layer using the ion implantation mask.

In Example 32, the subject matter of Example 31 includes, activating the implanted dopants by heating the second silicon carbide layer.

In Example 33, the subject matter of Examples 30-32 includes, wherein forming the second contact in the contact region comprises: forming a mask comprising openings that correspond to a location and geometry of the second contact; depositing a metal; annealing the metal; and removing the mask.

In Example 34, the subject matter of Example 33 includes, wherein the metal is nickel.

In Example 35, the subject matter of Examples 30-34 includes, wherein obtaining the second device structure comprises forming a second contact region on the second silicon carbide layer.

In Example 36, the subject matter of Example 35 includes, wherein bonding the bonding the first device structure to the second device structure at a dielectric layer comprises forming a second contact from a terminal of a second transistor in the first device structure to the second contact region.

In Example 37, the subject matter of Examples 28-36 includes, wherein the first conductivity type is n-type and the second conductivity type is p-type.

Example 38 is a method of fabricating silicon carbide device to switch an electrical signal, the method comprising: obtaining a first device structure, the first device structure comprising: a first substrate layer; a first transistor formed on a front side of the first substrate layer, the first transistor comprising a first terminal region, a second terminal region, and a control region; obtaining a second device structure, comprising: a second substrate layer comprising silicon carbide of a first conductivity type; a first silicon carbide layer of the first conductivity type, the first silicon carbide layer formed on a surface of the first substrate layer; a second silicon carbide layer of first conductivity type, the second silicon carbide layer formed on a surface of the first silicon carbide layer; a third silicon carbide layer of a second conductivity type, the third silicon carbide layer formed on a face of the second silicon carbide layer; and a contact region that comprises a cavity that extends from a surface of the third silicon carbide layer to contact the third silicon carbide layer; bonding the first device structure to the second device structure at a dielectric layer; and forming a contact that traverses a first terminal region of the switching device and the contact region to contact the third device structure.

In Example 39, the subject matter of Example 38 includes, wherein obtaining the second device structure comprises: forming the cavity by etching through the third silicon carbide layer and at least partially into the second silicon carbide layer; forming an oxide region on the side walls of the cavity; and forming a metal layer on the third silicon carbide layer and in the cavity.

In Example 40, the subject matter of Example 39 includes, wherein the metal layer comprises nickel silicide.

In Example 41, the subject matter of Example undefined includes, wherein obtaining the second device structure further comprises: forming a dielectric layer on the metal layer and the oxide region; and planarizing the dielectric layer.

Example 42 is at least one machine-readable medium including instructions that, when executed by processing circuitry, cause the processing circuitry to perform operations to implement of any of Examples 1-41.

Example 43 is an apparatus comprising means to implement of any of Examples 1-41.

Example 44 is a system to implement of any of Examples 1-41.

Example 45 is a method to implement of any of Examples 1-41.

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method of fabricating a hybrid silicon carbide switching device, the method comprising:

obtaining a first device structure, the first device structure comprising:
  a first substrate layer;
  a first transistor formed on a front side of the first substrate layer, the first transistor comprising a source region, a gate region, and a drain region;
obtaining a second device structure, the second device structure comprising:
  a second substrate layer comprising silicon carbide of a first conductivity type;
  a first silicon carbide layer of the first conductivity type;
  a second silicon carbide layer of a second conductivity type; and
  a first contact region of the first conductivity type, the first contact region traversing the second silicon carbide layer and contacting the first silicon carbide layer;
bonding the first device structure to the second device structure at a dielectric layer; and
forming a first contact to couple the drain region to the first contact region though a back-side of the first substrate layer.

2. The method of fabricating a hybrid silicon carbide switching device according to claim 1, wherein obtaining the first device structure comprises:
  forming the first transistor in the first substrate layer, the first substrate layer being formed on a passivation layer on a source wafer;
  bonding the first device structure to a carrier wafer; and
  removing the source wafer from the first device structure.

3. The method of fabricating a hybrid silicon carbide switching device according to claim 1, wherein the first substrate layer includes silicon.

4. The method of fabricating a hybrid silicon carbide switching device according to claim 1, wherein the first substrate layer includes gallium nitride.

5. The method of fabricating a hybrid silicon carbide switching device according to claim 1, wherein the first substrate layer includes gallium arsenide.

6. The method of fabricating a hybrid silicon carbide switching device according to claim 1, wherein the first substrate layer includes silicon.

7. The method of fabricating a hybrid silicon carbide switching device according to claim 1, wherein obtaining the second device structure comprises:
  forming the first contact region, including forming an ion implantation mask on the second silicon carbide layer.

8. The method of fabricating a hybrid silicon carbide switching device according to claim 7, wherein the ion implantation mask includes an opening that corresponds to a location of first contact region.

9. The method of fabricating a hybrid silicon carbide switching device according to claim 7, wherein forming the first contact region further includes:
  implanting dopants of the first conductivity type into the first silicon carbide layer and the second silicon carbide layer using the ion implantation mask and activating the dopants.

10. The method of fabricating a hybrid silicon carbide switching device according to claim 9, wherein activating the dopants includes heating the first silicon carbide layer or the second silicon carbide layer.

11. The method of fabricating a hybrid silicon carbide switching device according to claim 1, comprising:
  forming a second contact.

12. The method of fabricating a hybrid silicon carbide switching device according to claim 1, wherein the first conductivity type is an n+ type layer.

13. The method of fabricating a hybrid silicon carbide switching device according to claim 1, wherein obtaining the second device structure comprises:
  forming a third silicon carbide layer of the second conductivity type on a face of the second silicon carbide layer.

14. The method of fabricating a hybrid silicon carbide switching device according to claim 13, comprising:
  forming a cavity that extends from a surface of the third silicon carbide layer to contact the third silicon carbide layer.

15. The method of fabricating a hybrid silicon carbide switching device according to claim 14, wherein forming the cavity includes:
  etching through the third silicon carbide layer and at least partially into the second silicon carbide layer;
  forming an oxide region on walls of the cavity; and
  forming a metal layer on the third silicon carbide layer and in the cavity.

16. The method of fabricating a hybrid silicon carbide switching device according to claim 15, wherein the metal layer is a layer of nickel, and wherein obtaining the second device structure further includes:
  heating the nickel to form nickel silicide; and
  forming a dielectric layer on the nickel silicide and the oxide region.

* * * * *